United States Patent
Lee et al.

(10) Patent No.: US 9,048,330 B2
(45) Date of Patent: Jun. 2, 2015

(54) THREE-DIMENSIONAL GATE-WRAP-AROUND FIELD-EFFECT TRANSISTOR

(71) Applicant: Board of Regents, The University of Texas System, Austin, TX (US)

(72) Inventors: Jack C. Lee, Austin, TX (US); Fei Xue, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/012,254

(22) Filed: Aug. 28, 2013

(65) Prior Publication Data

US 2015/0060957 A1    Mar. 5, 2015

(51) Int. Cl.
H01L 29/76    (2006.01)
H01L 29/94    (2006.01)
H01L 31/113    (2006.01)
H01L 31/119    (2006.01)
H01L 29/808    (2006.01)
H01L 29/66    (2006.01)

(52) U.S. Cl.
CPC ...... *H01L 29/8086* (2013.01); *H01L 29/66924* (2013.01)

(58) Field of Classification Search
CPC ............... H01L 21/8238; H01L 21/82384; H01L 21/823842; H01L 29/49; H01L 29/4933; H01L 29/94
USPC .......... 257/337, 338, 351, 369, 382, E27.062, 257/E27.06
See application file for complete search history.

(56) References Cited

U.S. PATENT DOCUMENTS

2010/0330751 A1    12/2010    Choi et al.
2014/0001441 A1*    1/2014    Kim et al. ........................ 257/29

OTHER PUBLICATIONS

Xue et al., "Excellent Device Performance of 3D In0.53Ga0.47As Gate-Wrap-Around Field-Effect-Transistors with High-k Gate Dielectrics," Electron Devices Meeting (IEDM), 2012 IEEE International, Dec. 10-13, 2012.

* cited by examiner

*Primary Examiner* — Hoai V Pham
(74) *Attorney, Agent, or Firm* — Robert A. Voigt, Jr.; Winstead, P.C.

(57) ABSTRACT

A three-dimensional Gate-Wrap-Around Field-Effect Transistor (GWAFET). The GWAFET includes a substrate of III-V semiconductor material. The GWAFET further includes one or more channel layers with a gate wrapped around these one or more channel layers. Additionally, the GWAFET includes a barrier layer residing on the top channel layer with a layer of doped III-V semiconductor material residing on each end of the barrier layer. A source and drain contact are connected to the layer of doped III-V semiconductor material as well as to the multiple channels in the embodiment with the GWAFET including multiple channel layers. By having such a structure, integration density is improved. Furthermore, electrostatic control is improved due to gate coupling, which helps reduce standby power consumption. Furthermore, by using III-V semiconductor material as opposed to silicon, the current drive capacity is improved.

17 Claims, 11 Drawing Sheets

THREE-DIMENSIONAL GATE-WRAP-AROUND FIELD-EFFECT TRANSISTOR

TECHNICAL FIELD

The present invention relates generally to Complementary Metal-Oxide-Semiconductor (CMOS) devices, and more particularly to a three-dimensional gate-wrap-around field-effect transistor, where such a structure improves electron mobility and electrostatic control as well as increases integration density and reduces power consumption.

BACKGROUND

Complementary Metal-Oxide-Semiconductor (CMOS) devices are being scaled down aggressively in each technology generation to achieve higher integration density. However, the scaling of CMOS devices is approaching its physical limitations. For example, one significant factor limiting MOS scaling is off-state power consumption. Within digital logic, the sources that contribute to off-state power consumption include junction leakage, gate induced drain leakage, sub-threshold channel current, and gate tunnel currents. These become increasingly significant as the dimensions decrease. For instance, when the length of the channel (the channel can be visualized as the "stream" through which charges (e.g., electrons, holes) flow from the source to the drain of the transistor) in the CMOS device becomes so short, such as on the order of 20 nm, the transistor is unable to be turned off because of undesirable leakage current between the source and the drain. As a result, new materials and device structures are needed to enable further performance improvements.

BRIEF SUMMARY

In one embodiment of the present invention, a semiconductor device comprises a substrate comprising III-V semiconductor material. The semiconductor device further comprises a channel layer comprising III-V semiconductor material. Furthermore, the semiconductor device comprises a gate wrapped around the channel layer, where the gate is in direct contact with the channel layer and the substrate. Additionally, the semiconductor device comprises a barrier layer residing on the channel layer. The semiconductor device additionally comprises a layer of doped III-V semiconductor material residing on each end of the barrier layer. The semiconductor device further comprises a source contact connected to a first end of the layer of doped III-V semiconductor material. In addition, the semiconductor device comprises a drain contact connected to a second end of the layer of doped III-V semiconductor material.

In another embodiment of the present invention, a method for fabricating a gate-wrap-around field-effect transistor comprises depositing a buffer layer of III-V semiconductor material on a substrate of III-V semiconductor material. The method further comprises depositing a layer of III-V semiconductor material on the buffer layer to form a channel layer. The method additionally comprises depositing a barrier layer of III-V semiconductor material on the channel layer. Furthermore, the method comprises depositing a layer of doped III-V semiconductor material on the barrier layer to function as a caped layer. Additionally, the method comprises performing a gate recess to remove a portion of the doped layer of III-V semiconductor material. In addition, the method comprises patterning and etching a plurality of fins. The method further comprises performing a digital wet etch of the channel layer. The method additionally comprises removing the buffer layer underneath the channel layer. Additionally, the method comprises depositing titanium nitride to wrap around the channel. In addition, the method comprises reactively sputtering tantalum nitride on top of the titanium nitride. The method further comprises defining a gate by ion etching using a metal as a hardmask. The method additionally comprises forming a source and a drain contact on the layer of doped III-V semiconductor material.

In another embodiment of the present invention, a semiconductor device comprises a substrate comprising III-V semiconductor material. The semiconductor device further comprises a plurality of alternating channel and buffer layers, where each of the alternating channel and buffer layers comprises III-V semiconductor material. The semiconductor device additionally comprises a gate wrapped around the alternating channel layers, where the gate is in direct contact with each of the channel layers and the substrate. Furthermore, the semiconductor device comprises a barrier layer residing on a top channel layer of the channel layers. Additionally, the semiconductor device comprises a layer of doped III-V semiconductor material residing on each end of the barrier layer. In addition, the semiconductor device comprises a source contact connected to the plurality of channel layers, the barrier layer and a first end of the layer of doped III-V semiconductor material. The method further comprises a drain contact connected to the plurality of channel layers, the barrier layer and a second end of the layer of doped III-V semiconductor material.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWINGS

A better understanding of the present invention can be obtained when the following detailed description is considered in conjunction with the following drawings, in which:

FIG. 1A-A illustrates a cross-section of the schematic device structure of the three-dimensional gate-wrap-around field-effect transistor of FIG. 1A in accordance with an embodiment of the present invention;

FIG. 1A-B illustrates another cross-section of the schematic device structure of the three-dimensional gate-wrap-around field-effect transistor of FIG. 1A in accordance with an embodiment of the present invention;

DETAILED DESCRIPTION

As discussed in the Background section, Complementary Metal-Oxide-Semiconductor (CMOS) devices are being scaled down aggressively in each technology generation to achieve higher integration density. However, the scaling of CMOS devices is approaching its physical limitations. For example, one significant factor limiting MOS scaling is off-state power consumption. Within digital logic, the sources that contribute to off-state power consumption include junction leakage, gate induced drain leakage, subthreshold channel current, and gate tunnel currents. These become increasingly significant as the dimensions decrease. For instance, when the length of the channel in the CMOS device becomes so short, such as on the order of 20 nm, the transistor is unable to be turned off because of undesirable leakage current between the source and the drain. The channel can be visualized as the "stream" through which electrons or holes flow from the source to the drain of the n-channel and p-channel transistor, respectively. As a result, new materials and device structures are needed to enable further performance improvements.

Figure 1A:
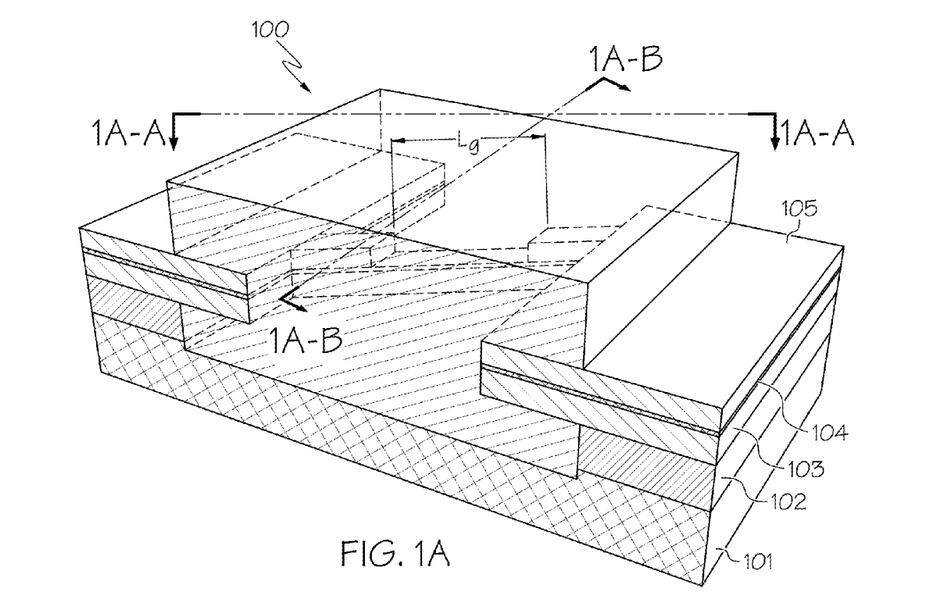
FIG. 1A illustrates a schematic device structure of a three-dimensional gate-wrap-around field-effect transistor in accordance with an embodiment of the present invention.
Figure 1B:
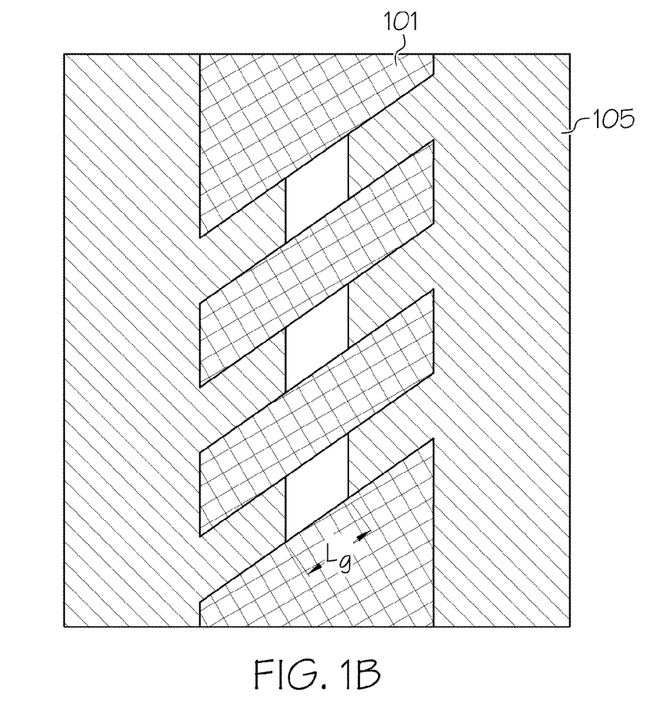
FIG. 1B illustrates a top view of the fin structure without the gate stack in accordance with an embodiment of the present invention.
Figure 2:
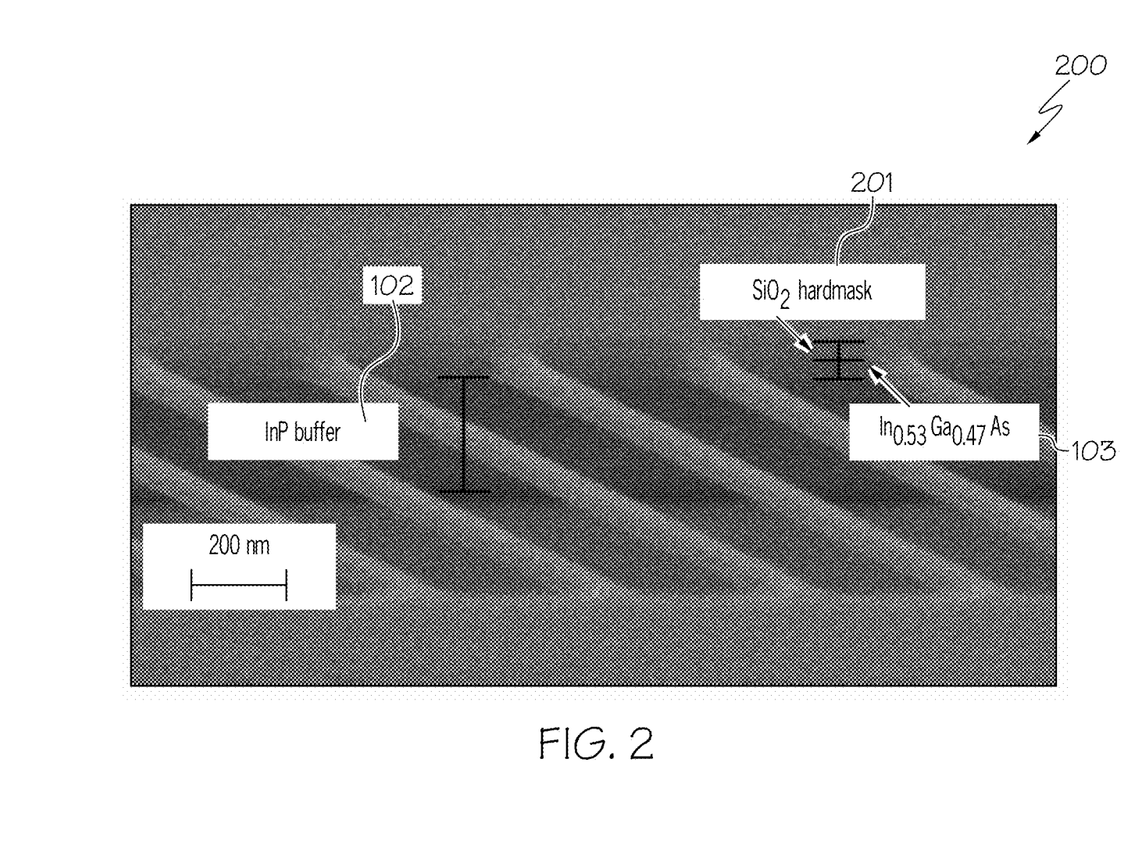
FIG. 2 illustrates a scanning electron microscope (SEM) image of the fin structure in accordance with an embodiment of the present invention.
Figure 3A:
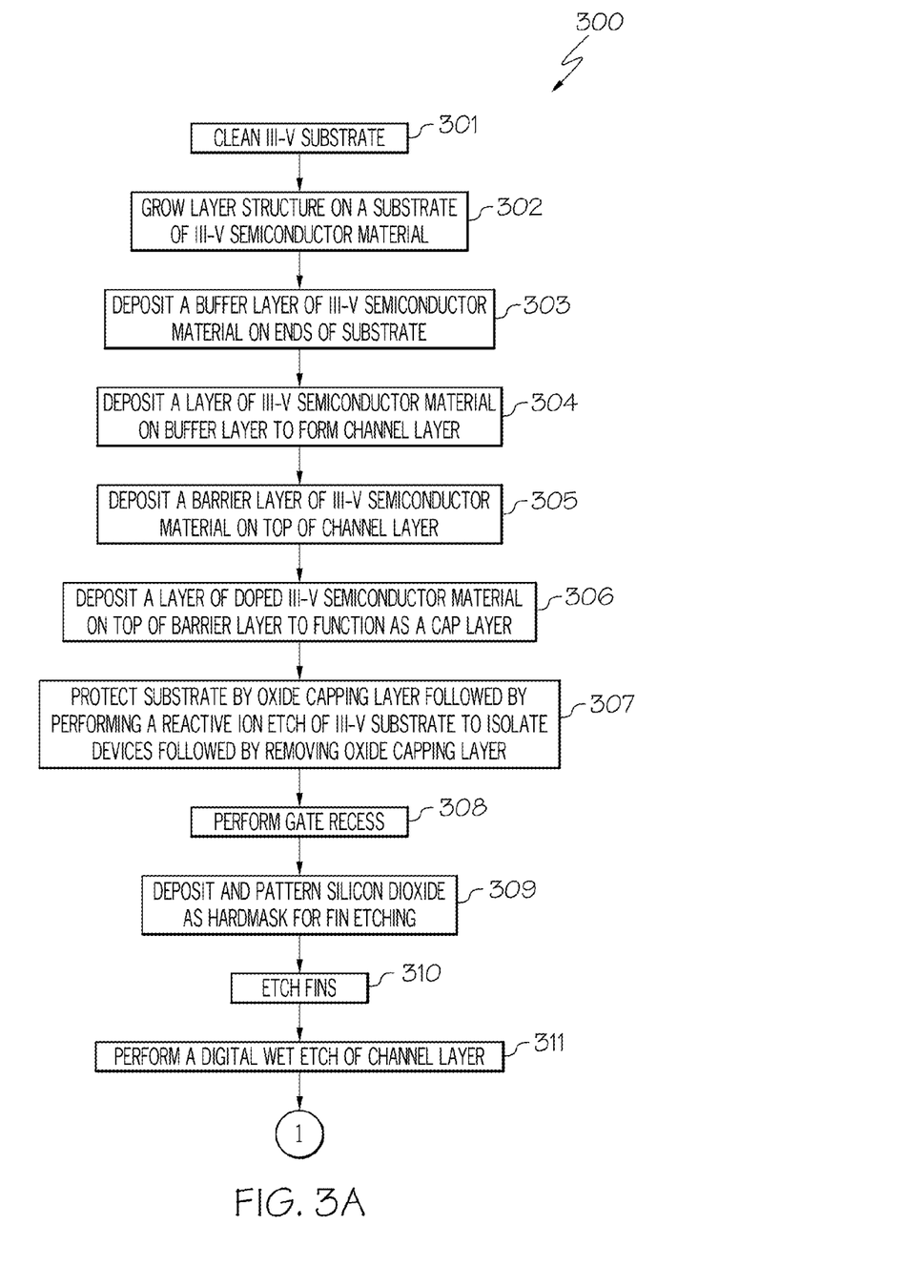
FIGS. 3A-3B are a flowchart of a method for fabricating the gate-wrap-around field-effect transistor of FIGS. 1A, 1A-A, 1A-B, 1B and 2 in accordance with an embodiment of the present invention.
Figure 3B:
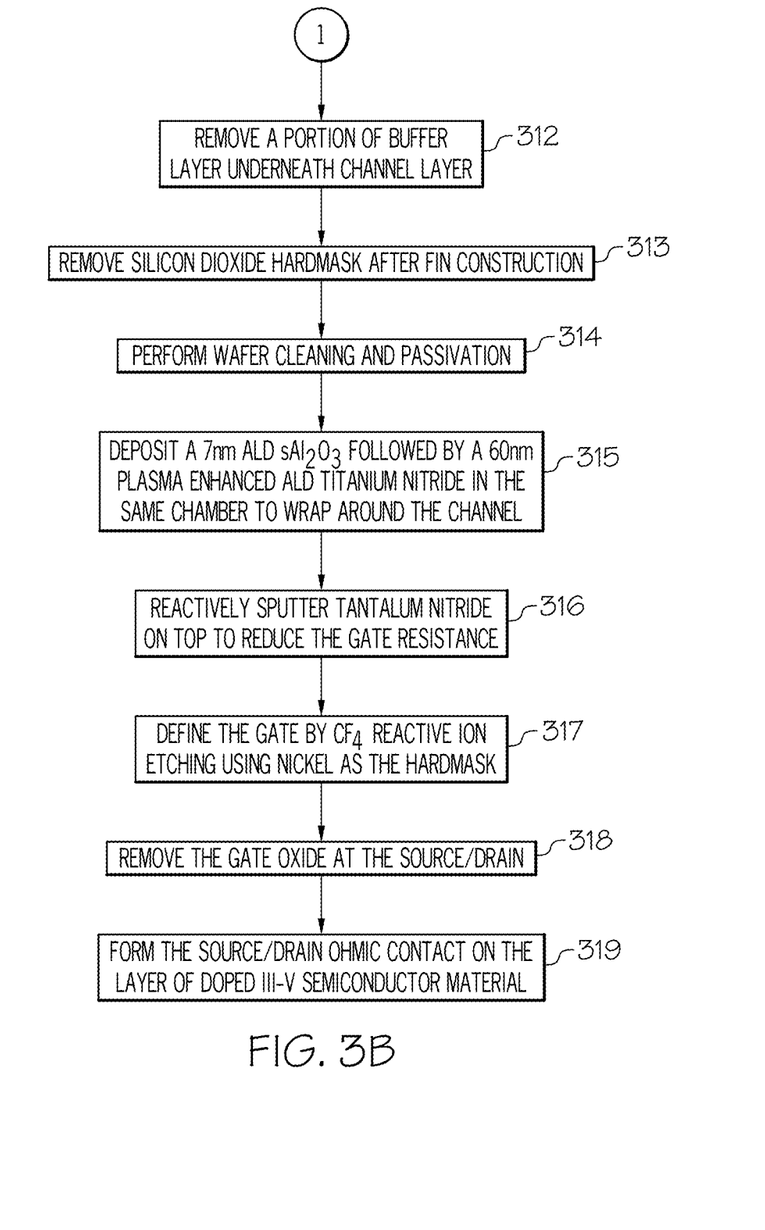
Figure 4:
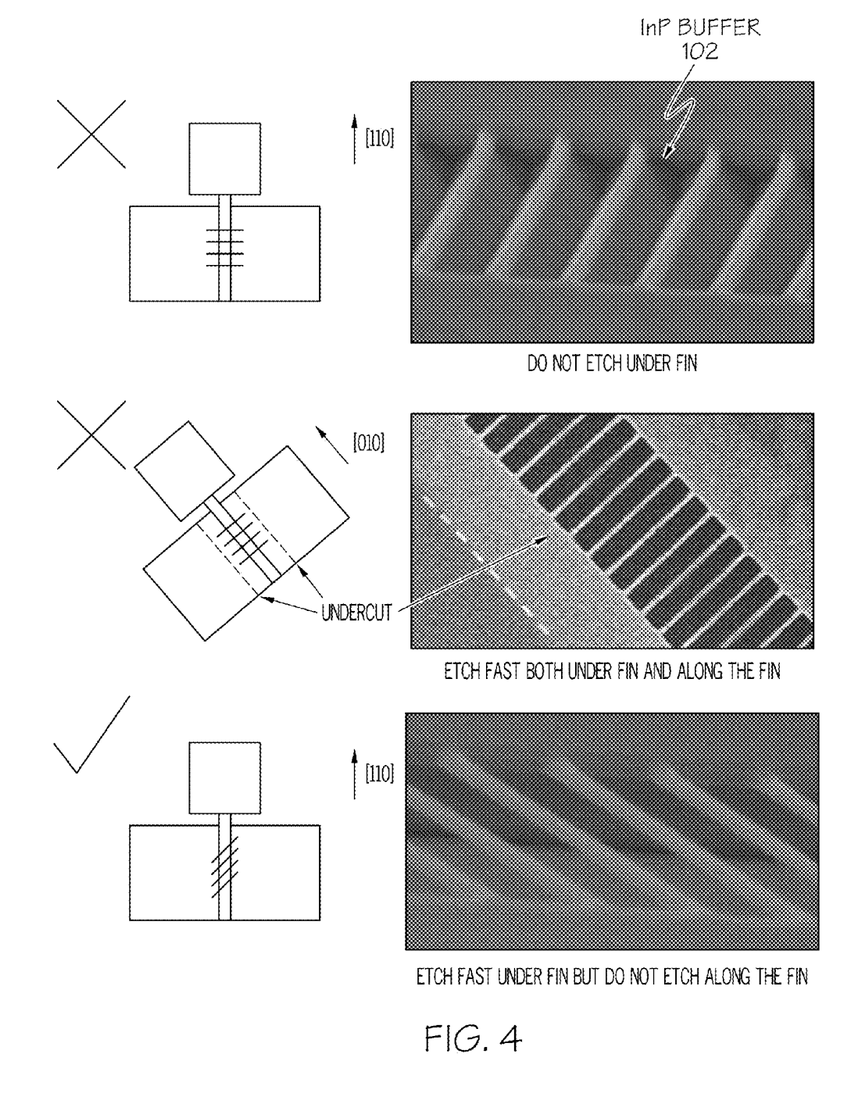
FIG. 4 illustrates the patterning of the fins in accordance with an embodiment of the present invention.
Figure 5:
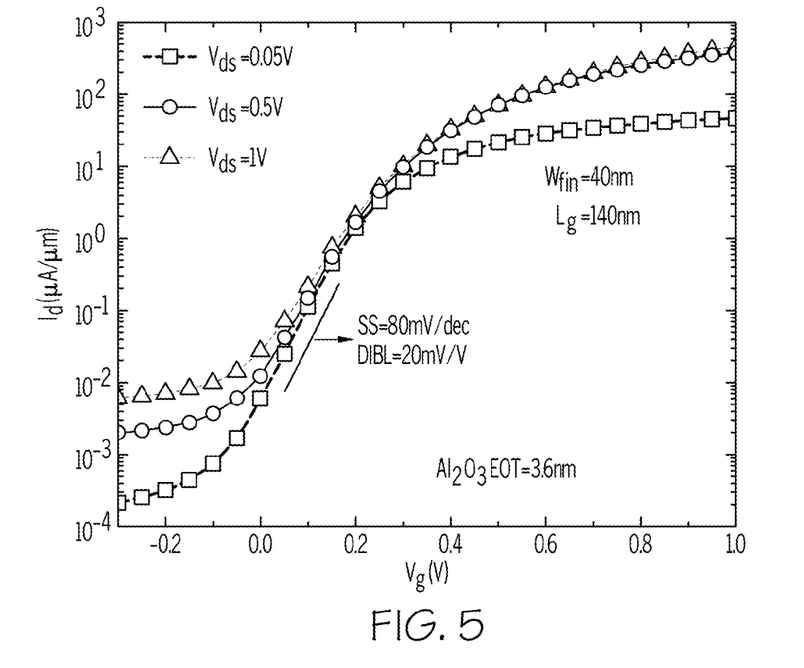
FIG. 5 illustrates the transfer characteristics of a typical $In_{0.53}Ga_{0.47}As$ gate-wrap-around field-effect transistor in accordance with an embodiment of the present invention.
Figure 6:
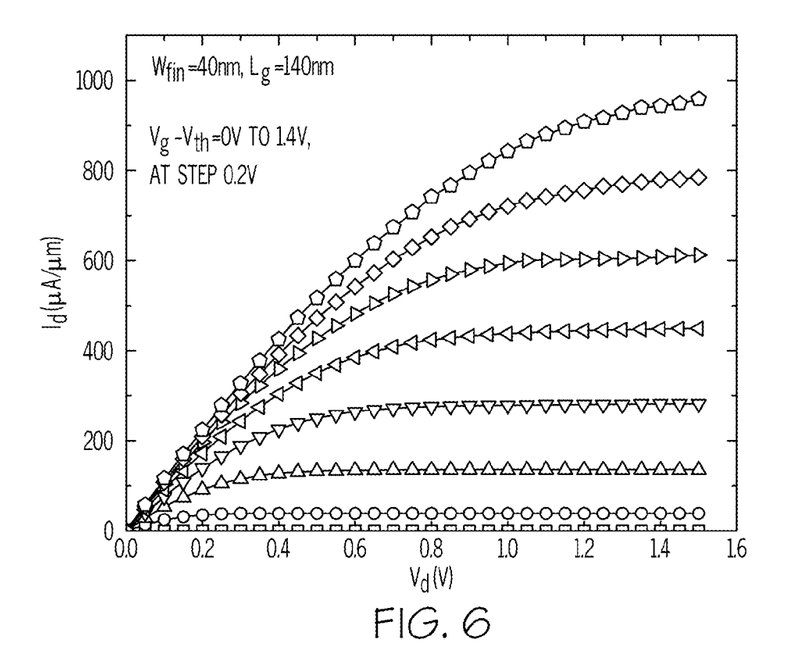
FIG. 6 illustrates the current drive capability of the $In_{0.53}Ga_{0.47}As$ gate-wrap-around field-effect transistor in accordance with an embodiment of the present invention.
Figure 7:
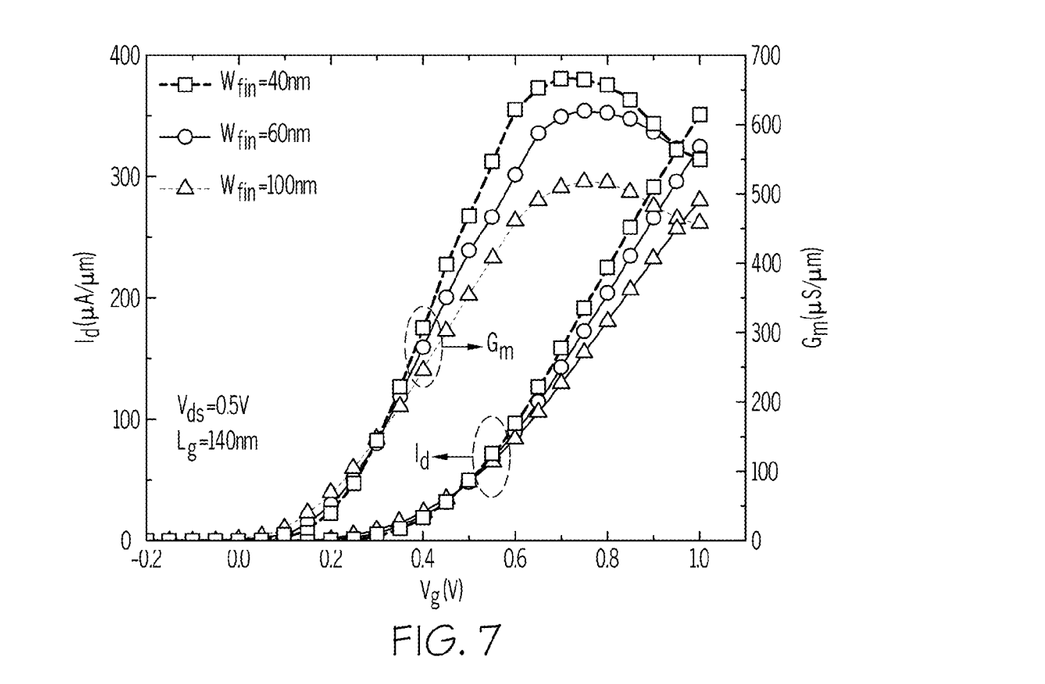
FIG. 7 illustrates the comparison of the drive current and extrinsic transconductance for $W_{fin}$=40 nm, 60 nm and 100 nm devices in accordance with an embodiment of the present invention.
Figure 8:
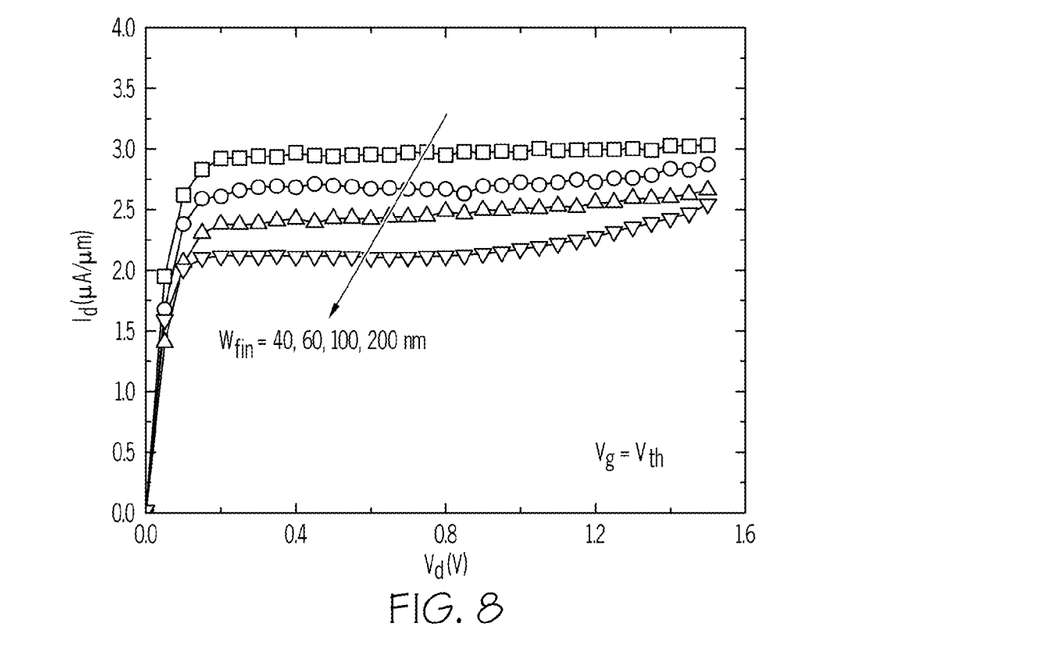
FIG. 8 illustrates that less drain current overshoot for smaller $W_{fin}$ devices indicates a better short-channel effect (SCE) control in accordance with an embodiment of the present invention.
Figure 9:
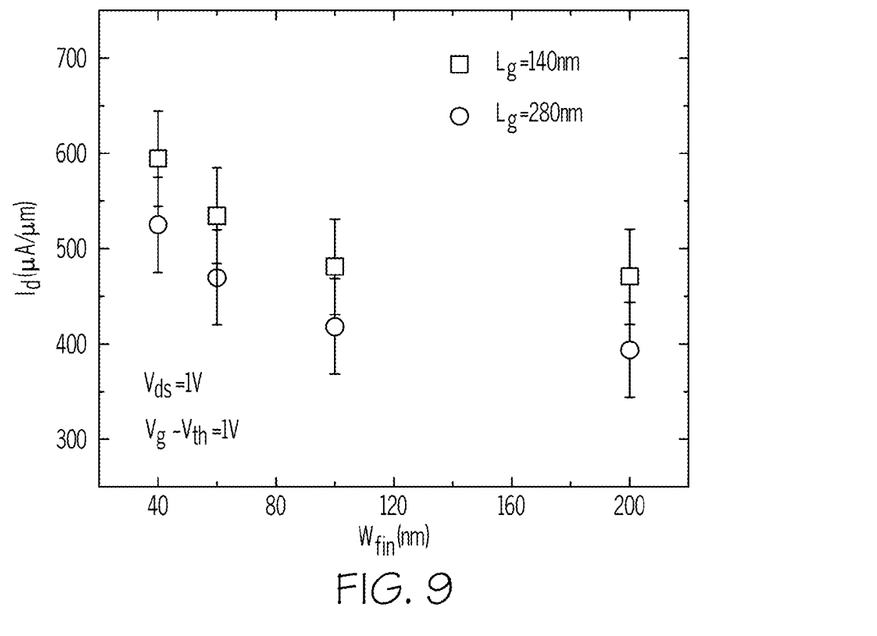
FIGS. 9 and 10 illustrate scaling metrics for the $In_{0.53}Ga_{0.47}As$ gate-wrap-around field-effect transistor with various gate length and $W_{fin}$ in accordance with an embodiment of the present invention.
Figure 10:
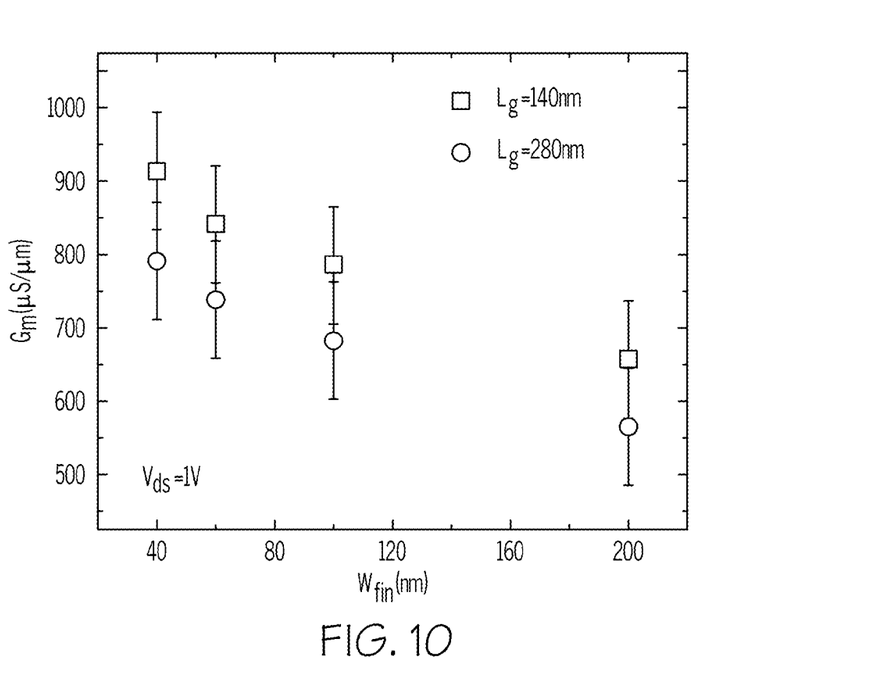
Figure 11:
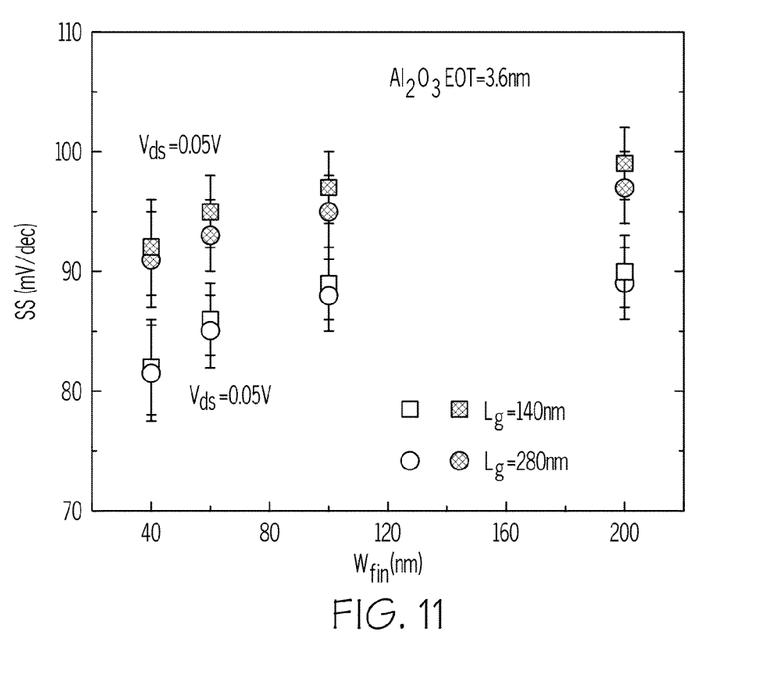
FIG. 11 illustrates that low subthreshold swing (SS) values (80 mV/dec) suggest a high interface quality at the $In_{0.53}Ga_{0.47}As$ channel sidewall and bottom surfaces in accordance with an embodiment of the present invention.
Figure 12:
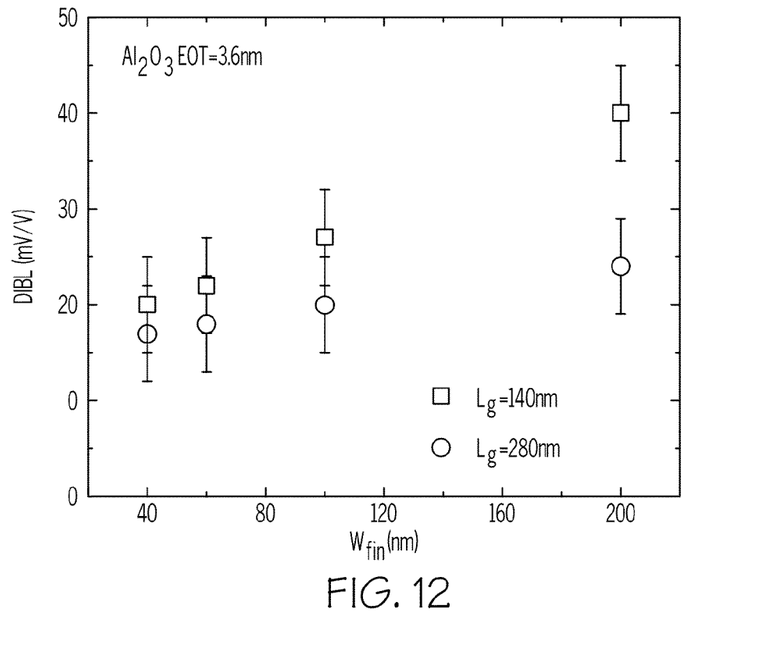
FIG. 12 illustrates that drain-induced-barrier lowering (DIBL) reduces from 40 mV/V for $W_{fin}$=200 nm to 20 mV/V for 40 nm devices, indicating a more effective gate coupling for narrower fin devices in accordance with an embodiment of the present invention.
Figure 13:
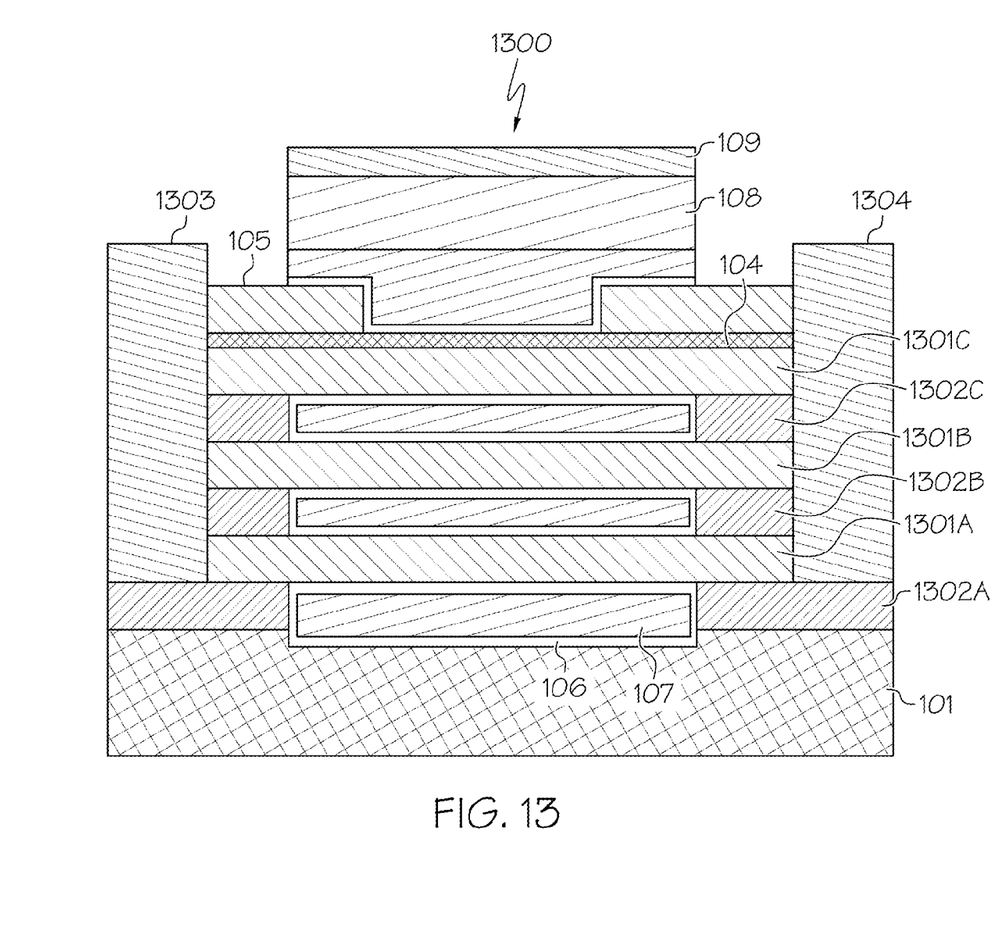
FIG. 13 illustrates a schematic device structure of a three-dimensional gate-wrap-around field-effect transistor with multiple channels in accordance with an embodiment of the present invention.

The principles of the present invention provide a process and structure for a novel Field-Effect Transistor (FET) with a three-dimensional (3D) gate-wrap-around structure that includes one or more channel layers (one embodiment includes a single channel layer and another embodiment includes multiple channel layers) that results in improving the electron mobility and electrostatic control as well as increasing the integration density and reducing the power consumption as discussed below in connection with FIGS. 1A, 1A-A, 1A-B, 1B, 2, 3A-3B and 4-13. FIG. 1A illustrates a schematic device structure of a three-dimensional gate-wrap-around field-effect transistor. FIG. 1A-A illustrates a cross-section of the schematic device structure of the three-dimensional gate-wrap-around field-effect transistor of FIG. 1A. FIG. 1A-B illustrates another cross-section of the schematic device structure of the three-dimensional gate-wrap-around field-effect transistor of FIG. 1A. FIG. 1B illustrates a top view of the fin structure without the gate stack. FIG. 2 illustrates a scanning electron microscope (SEM) image of the fin structure. FIGS. 3A-3B are a flowchart of a method for fabricating the gate-wrap-around field-effect transistor of FIGS. 1A, 1A-A, 1A-B, 1B and 2. FIG. 4 illustrates the patterning of the fins. FIG. 5 illustrates the transfer characteristics of a typical $In_{0.53}Ga_{0.47}As$ gate-wrap-around field-effect transistor. FIG. 6 illustrates the current drive capability of the $In_{0.53}Ga_{0.47}As$ gate-wrap-around field-effect transistor. FIG. 7 illustrates the comparison of the drive current and extrinsic transconductance for $W_{fin}$=40 nm, 60 nm and 100 nm devices. FIG. 8 illustrates that less drain current overshoot for smaller $W_{fin}$ devices indicates a better short-channel effect (SCE) control. FIGS. 9 and 10 illustrate scaling metrics for the $In_{0.53}Ga_{0.47}As$ gate-wrap-around field-effect transistor with various gate length and $W_{fin}$. FIG. 11 illustrates that low subthreshold swing (SS) values (80 mV/dec) suggest a high interface quality at the $In_{0.53}Ga_{0.47}As$ channel sidewall and bottom surfaces. FIG. 12 illustrates that drain-induced-barrier lowering (DIBL) reduces from 40 mV/V for $W_{fin}$=200 nm to 20 mV/V for 40 nm devices, indicating a more effective gate coupling for narrower fin devices. FIG. 13 illustrates a schematic device structure of a three-dimensional gate-wrap-around field-effect transistor with multiple channels.

Referring now to the Figures in detail, FIG. 1A illustrates the schematic device structure of a three-dimensional (3D) $In_{0.53}Ga_{0.47}As$ gate-wrap-around field-effect transistor (GWAFET) 100 with atomic layer deposition (ALD) of the $Al_2O_3$/TiN gate wrapped around in accordance with an embodiment of the present invention. FIG. 1A-A illustrates a cross-section of the schematic device structure of the three-dimensional gate-wrap-around field-effect transistor of FIG. 1A in accordance with an embodiment of the present invention. FIG. 1A-B illustrates another cross-section of the schematic device structure of the three-dimensional gate-wrap-around field-effect transistor of FIG. 1A in accordance with an embodiment of the present invention. FIG. 1B illustrates the top view of the fin structure without the gate stack in accordance with an embodiment of the present invention. The SEM image of the fin structure 200 is shown in FIG. 2 in accordance with an embodiment of the present invention.

A process for fabricating GWAFET 100 of the present invention shown in FIGS. 1A, 1A-A, 1A-B, 1B and 2 is described below in connection with FIGS. 3A-3B.

FIGS. 3A-3B are a flowchart of a method 300 for fabricating GWAFET 100 of FIGS. 1A, 1A-A, 1A-B, 1B and 2 in accordance with an embodiment of the present invention.

Referring to FIG. 3A, in conjunction with FIGS. 1A, 1A-A, 1A-B, 1B and 2, in step 301, substrate 101 is cleaned.

In step 302, the layer structure is grown on a substrate 101 of III-V semiconductor material (e.g., indium phosphide (InP)). In one embodiment, the layer structure is grown by molecular beam epitaxy.

In step 303, a buffer layer of III-V semiconductor material 102 (e.g., InP) is deposited on the ends of substrate 101. In one embodiment, the thickness of buffer layer 102 is 500 nm. In one embodiment, InP was chosen as buffer layer 102 to enable a selective wet etch between $In_{0.53}Ga_{0.47}As$ 103 (discussed below) and InP 102 to release the $In_{0.53}Ga_{0.47}As$ fin structure as discussed further below.

In step 304, a layer of III-V semiconductor material 103 (e.g., indium gallium arsenide ($In_{0.53}Ga_{0.47}As$)) 103 is deposited on buffer layer 102 to form a channel layer. In one embodiment, the thickness of layer 103 is 50 nm.

In step 305, a barrier layer of III-V semiconductor material 104 (e.g., InP) is deposited on top of channel layer 103. In one embodiment, the thickness of barrier layer 104 is 1 nm. In one embodiment, barrier layer 104 was added to keep the high-k dielectric/III-V interface away from channel layer 103. In this manner, the effective channel mobility is significantly improved due to reduced scattering.

In step 306, a layer of doped III-V semiconductor material 105 (e.g., InGaAs) is deposited on top of barrier layer 104 to function as a cap layer. In one embodiment, layer 105 is heavily doped for n-type doping (e.g., n+ InGaAs) intended for the source/drain.

In step 307, substrate 101 of III-V semiconductor material is protected by an oxide capping layer followed by performing a reactive ion etch of substrate 101 of III-V semiconductor material followed by removing the oxide capping layer.

In step 308, gate recess was performed, such as by using a citric acid based wet etch to remove a portion of the n+ layer 105.

In step 309, silicon dioxide ($SiO_2$) 201 is deposited and patterned, such as by e-beam lithography using diluted ZEP520A as a photoresist, as a hardmask for fin etching.

In step 310, fins are etched, such as by $CH_4/H_2$ inductively coupled plasma etching using silicon dioxide ($SiO_2$) 201 as a hardmask. Specifically, fins are patterned in a manner as shown in FIG. 4 in accordance with an embodiment of the present invention such that buffer 102 underneath the fins are etched in a fast rate without creating a large undercut in the source/drain area. In this manner, leakage current is significantly reduced, fins are more robust and the device yield is higher.

In step 311, a digital wet etch of $In_{0.53}Ga_{0.47}As$ layer 103 is performed, such as by soaking samples in $H_2O_2$ and $H_2SO_4$ separately for a certain time to enable a complete chemical reaction. In one embodiment, three cycles were used and ~5 nm of $In_{0.53}Ga_{0.47}As$ layer 103 was removed on each side. It is believed that this step helps reduce the surface roughness significantly after the dry etch.

Referring now to FIG. 3B, in conjunction with FIGS. 1A, 1A-A, 1A-B, 1B and 2, in step 312, a portion of buffer layer 102 underneath channel 103 is removed, such as by diluted HCl solution.

In step 313, after the fin construction, $SiO_2$ hardmask 201 is removed, such as by buffered oxide etch (BOE).

In step 314, wafer cleaning and passivation are performed such that the sample is dipped in $(NH_4)_2S$ for surface passivation.

In step 315, a 7 nm ALD $sAl_2O_3$ (i.e. equivalent oxide thickness, EOT of 3.6 nm) is deposited and followed by a 60 nm plasma enhanced ALD titanium nitride (TiN) 107 in the same chamber to wrap around the channel. It is noted that such thicknesses of $Al_2O_3$ and TiN 107 are exemplary and that the thicknesses of $Al_2O_3$ and TiN 107 can be changed depending on the application.

In step 316, tantalum nitride (TaN) 108 is then reactively sputtered on top to reduce the gate resistance. The principles of the present invention are not to be limited to using tantalum nitride in reducing the gate resistance. Other metals may be used to reduce the gate resistance.

In step 317, the gate is then defined by $CF_4$ reactive ion etching using nickel (Ni) 109 as the hardmask.

In step 318, the gate oxide at the source/drain is removed, such as by a BOE dip.

In step 319, the source/drain ohmic contact 110, 111 is formed on layer 105, such as by e-beam evaporation Pd/Ge/Ti/Pd and rapid thermal annealing at 320° C. for 90 s. In one embodiment, the source/drain metal to gate distance is 1 µm; $W_{fin}$ is from 40 nm to 200 nm; gate length is from 140 nm and 280 nm; and a different number of parallel channels are fabricated (see FIG. 1A for $L_g$, $W_{fin}$, $H_{fin}$ definitions). It is noted that $L_g$ and $W_{fin}$ are measured under scanning electron microscope (SEM).

In some implementations, method 300 may include other and/or additional steps that, for clarity, are not depicted. Further, in some implementations, method 300 may be executed in a different order presented and that the order presented in the discussion of FIGS. 3A-3B is illustrative. Additionally, in some implementations, certain steps in method 300 may be executed in a substantially simultaneous manner or may be omitted.

A discussion of the characterization of device 100 is now deemed appropriate. Referring to FIGS. 1A, 1A-A, 1A-B, 1B, 2 and 4, the transfer characteristics of a typical $In_{0.53}Ga_{0.47}As$ GWAFET 100 with $W_{fin}$=40 nm $L_g$=140 nm and 7 parallel channels are illustrated in FIG. 5 in accordance with an embodiment of the present invention. Device performances are normalized to the perimeter of InGaAs channel 103 $W_{tot}$=($2W_{fin}$+$2H_{fin}$)×(No. of channels). The gate leakage is less than $10^{-5}$ mA/mm. Device 100 exhibits an on/off current ratio of around $4\times10^4$ at $V_d$=1 V. The threshold voltage is extracted by the linear extrapolation of the maximum transconductance to be 0.23 V.

The current drive capability of $In_{0.53}Ga_{0.47}As$ GWAFET 100 ($W_{fin}$=40 nm, $L_g$=140 nm) is shown in FIG. 6 in accordance with an embodiment of the present invention with $Id_{sat}$~613 mA/mm at $V_g$-$V_{th}$=1V. The source/drain resistance was extracted using gate length dependence to be ~930 ohm*µm. High source resistance may be due to InP barrier layer 104 at the source and drain region and the large source/drain to gate distance.

FIG. 7 compares the drive current and extrinsic transconductance for $W_{fin}$=40 nm, 60 nm and 100 nm devices in accordance with an embodiment of the present invention. Higher current drive capacity and increased $V_{th}$ was observed by narrowing down $W_{fin}$ due to stronger quantum confinement effects.

Less drain current overshoot for smaller $W_{fin}$ devices indicates a better short-channel effect (SCE) control as shown in FIG. 8 in accordance with an embodiment of the present invention.

FIGS. 9 and 10 illustrate scaling metrics for $In_{0.53}Ga_{0.47}As$ GWAFET 100 with various gate lengths and $W_{fin}$ in accordance with an embodiment of the present invention. Drive current and transconductance per unit width increases with decreasing $W_{fin}$. This demonstrates excellent device scalability.

The low subthreshold swing (SS) values (80 mV/dec) suggest a high interface quality at the sidewall of $In_{0.53}Ga_{0.47}As$ channel 103 and bottom surfaces as shown in FIG. 11 in accordance with an embodiment of the present invention.

Drain-induced-barrier lowering (DIBL) reduces from 40 mV/V for $W_{fin}$=200 nm to 20 mV/V for 40 nm devices, indicating a more effective gate coupling for narrower fin devices as shown in FIG. 12 in accordance with an embodiment of the present invention. SS and DIBL can be further reduced by shrinking $Al_2O_3$ 106 thickness.

As shown herein, 3D $In_{0.53}Ga_{0.47}As$ GWAFETs 100 exhibit excellent high performance with high-k dielectrics and a metal gate. Low SS of 80 mV/dec, DIBL of 20 mV/V and high drive current of 600 mA/mm at $V_d$=1 V and $V_g$-$V_{th}$=1 V were obtained. $In_{0.53}Ga_{0.47}As$ GWAFETs 100 have been demonstrated to exhibit improved performance over FinFETs and planar devices and are promising candidates for future scaled MOSFET devices.

The electrostatic control as well as the current drive capability and integration density of 3D $In_{0.53}Ga_{0.47}As$ GWAFETs 100 may be improved by fabricating multiple channels in 3D GWAFET 1300 as shown in FIG. 13 in accordance with an embodiment of the present invention. Layers of GWAFET 1300 that are the same as GWAFET 100 include the same reference numerals.

Referring to FIG. 13, in conjunction with FIGS. 1A, 1A-A, 1A-B, 1B, GWAFET 1300 is fabricated similarly as GWAFET 100 except that GWAFET 1300 includes multiple (e.g., three) channel layers 1301A-1301C of III-V semiconductor material (e.g., InGaAs) interspersed with buffer layers 1302A-1302C, respectively, of III-V semiconductor material (e.g., InP). Channel layers 1301A-1301C may collectively or individually be referred to as channel layers 1301 or channel layer 1301, respectively. Channel layers 1301 function similarly to channel layer 103 of FIGS. 1A and 1B. Buffer layers 1302A-1302C may collectively or individually be referred to as buffer layers 1302 or buffer layer 1302, respectively. Buffer layers 1302 function similarly to buffer layer 102 of FIG. 1A.

The structure of GWAFET 1300 is not to be limited in scope to the depiction of FIG. 13. More channel layers 1301 can be added to the structure of GWAFET 1300 using alternative layers (e.g., InGaAs/InP/InGaAs/InP/etc.). The InGaAs/InP system was selected to enable the fin releasing process. In one embodiment, buffer layers 1302B, 1302C are designed to be highly doped to reduce contact resistance.

In one embodiment, source and drain contacts 1303, 1304 are made by contact holes from top channel layer 1301C to bottom channel layer 1301A to enable the contact metal to directly reach each channel layer 1301.

In comparison to current technology, three-dimensional InGaAs GWAFETs 1300 with multiple channel layers 1301 provide several advantages, such as being fabricated using III-V semiconductor materials with better transport properties than silicon. By using III-V semiconductor material instead of silicon, the electrons possess a lower effective mass and higher mobility thereby improving the current drive capacity. Furthermore, three-dimensional InGaAs GWAFETs 1300 with multiple channel layers 1301 provide better electrostatic control due to gate coupling, which helps reduce standby power consumption. Additionally, a higher current density is achieved by having multiple channel layers 1301 stacked vertically while the area of the device remains unchanged.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A semiconductor device, comprising:
   a substrate comprising III-V semiconductor material;
   a channel layer comprising III-V semiconductor material;
   a gate wrapped around said channel layer, wherein said gate is in direct contact with said channel layer and said substrate;
   a barrier layer residing on said channel layer;
   a layer of doped III-V semiconductor material residing on each end of said barrier layer;
   a source contact connected to a first end of said layer of doped III-V semiconductor material; and
   a drain contact connected to a second end of said layer of doped III-V semiconductor material.

2. The semiconductor device as recited in claim 1 further comprising:
   a buffer layer in contact with a portion of said gate, wherein said buffer layer separates said channel layer and said substrate.

3. The semiconductor device as recited in claim 2, wherein said buffer layer comprises indium phosphide.

4. The semiconductor device as recited in claim 2, wherein a thickness of said buffer layer is approximately 500 nm.

5. The semiconductor device as recited in claim 1 further comprising:
   a barrier layer separating said channel layer and said layer of doped III-V semiconductor material.

6. The semiconductor device as recited in claim 5, wherein said barrier layer comprises indium phosphide.

7. The semiconductor device as recited in claim 5, wherein a thickness of said barrier layer is approximately 1 nm.

8. The semiconductor device as recited in claim 1, wherein said channel layer comprises indium gallium arsenide.

9. The semiconductor device as recited in claim 1, wherein a thickness of said channel layer is approximately 50 nm.

10. The semiconductor device as recited in claim 1 further comprising:
    a layer of aluminum oxide separating said channel layer and said gate.

11. The semiconductor device as recited in claim 1, wherein said substrate comprises semi-insulating indium phosphide.

12. A semiconductor device, comprising:
    a substrate comprising III-V semiconductor material;
    a plurality of alternating channel and buffer layers, where each of said alternating channel and buffer layers comprises III-V semiconductor material;
    a gate wrapped around said alternating channel layers, wherein said gate is in direct contact with each of said channel layers and said substrate;
    a barrier layer residing on a top channel layer of said channel layers;
    a layer of doped III-V semiconductor material residing on each end of said barrier layer;
    a source contact connected to said plurality of channel layers, said barrier layer and a first end of said layer of doped III-V semiconductor material; and
    a drain contact connected to said plurality of channel layers, said barrier layer and a second end of said layer of doped III-V semiconductor material.

13. The semiconductor device as recited in claim 12 further comprising:
    a layer of aluminum oxide separating said channel layers and said gate.

14. The semiconductor device as recited in claim 12, wherein said channel layers comprise indium gallium arsenide.

15. The semiconductor device as recited in claim 12, wherein said barrier layer separates said top channel layer of said channel layers and said layer of doped III-V semiconductor material, wherein said barrier layer comprises III-V semiconductor material.

16. The semiconductor device as recited in claim 12, wherein said buffer layers comprise indium phosphide.

17. The semiconductor device as recited in claim 12, wherein a first buffer layer of said buffer layers in contact with said substrate comprises undoped III-V semiconductor material, wherein the remaining buffer layers of said buffer layers comprise doped III-V semiconductor material.

\* \* \* \* \*